(12) United States Patent
Zaerpoor

(10) Patent No.: US 7,132,839 B2
(45) Date of Patent: Nov. 7, 2006

(54) ULTRA-SHORT LOW-FORCE VERTICAL PROBE TEST HEAD AND METHOD

(75) Inventor: Koorosh Zaerpoor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,188

(22) Filed: Dec. 31, 2002

(65) Prior Publication Data

US 2004/0124861 A1 Jul. 1, 2004

(51) Int. Cl.
*G01R 31/02* (2006.01)

(52) U.S. Cl. .................................. 324/754; 324/761
(58) Field of Classification Search ................. 324/761, 324/754, 757, 755, 756, 158.1; 439/72
See application file for complete search history.

(56) References Cited

U.S. PATENT DOCUMENTS

| 4,724,383 A | * | 2/1988 | Hart | 324/754 |
| 5,252,916 A | * | 10/1993 | Swart | 324/757 |
| 5,389,885 A | * | 2/1995 | Swart | 324/761 |
| 6,084,421 A | * | 7/2000 | Swart et al. | 324/755 |
| 6,356,098 B1 | | 3/2002 | Akram et al. | |

OTHER PUBLICATIONS

"COBRA Vertical Technology Probe Cards", Available from http://www.wentworthlabs.com/product/cobra.htm, 3 pages.
"Yield-Enhancing WaferProbe PH-Series Probe Cards", Available from http://www.formfactor.com/FormFactor%20Online/downloadables/WaferProbe%20PH-Series.pdf, 2 pages.

* cited by examiner

*Primary Examiner*—David Zarneke
*Assistant Examiner*—Tung X. Nguyen
(74) *Attorney, Agent, or Firm*—Schwegman, Lundberg, Woessner & Kluth, P.A.

(57) ABSTRACT

A method and apparatus for making a probe head that is very short (in the direction vertical) and exerts low force on the contacts of the circuit being tested, and on its own pins. The probe head is moved in the vertical direction to contact the IC being tested. Each pin is in sliding contact with an electrical contact on a space-transformer substrate, such as a post that slides within a sleeve. Each pin is also held in a diaphragm, such as an elastic membrane, in order to provide gentle force of the pin against the contact point of the circuit being tested. One or more walls or supports around each pin hold portions of the diaphragm in place so a deflection of one pin will not lift neighboring pins off their contacts.

16 Claims, 2 Drawing Sheets

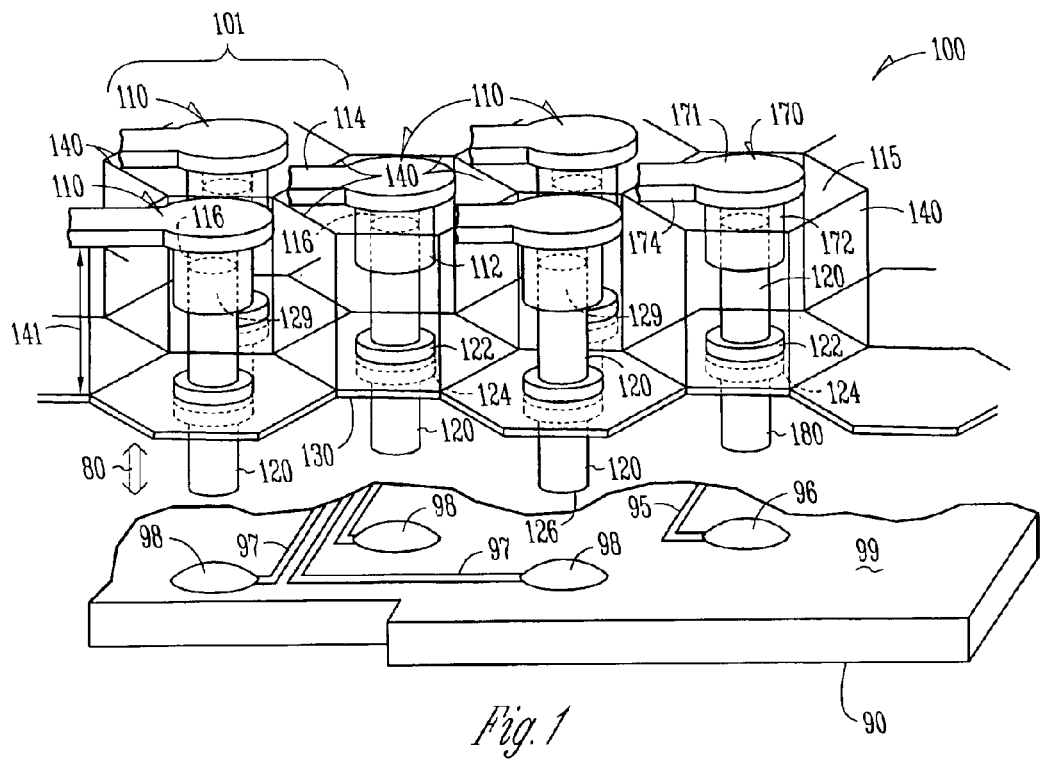
Fig. 1
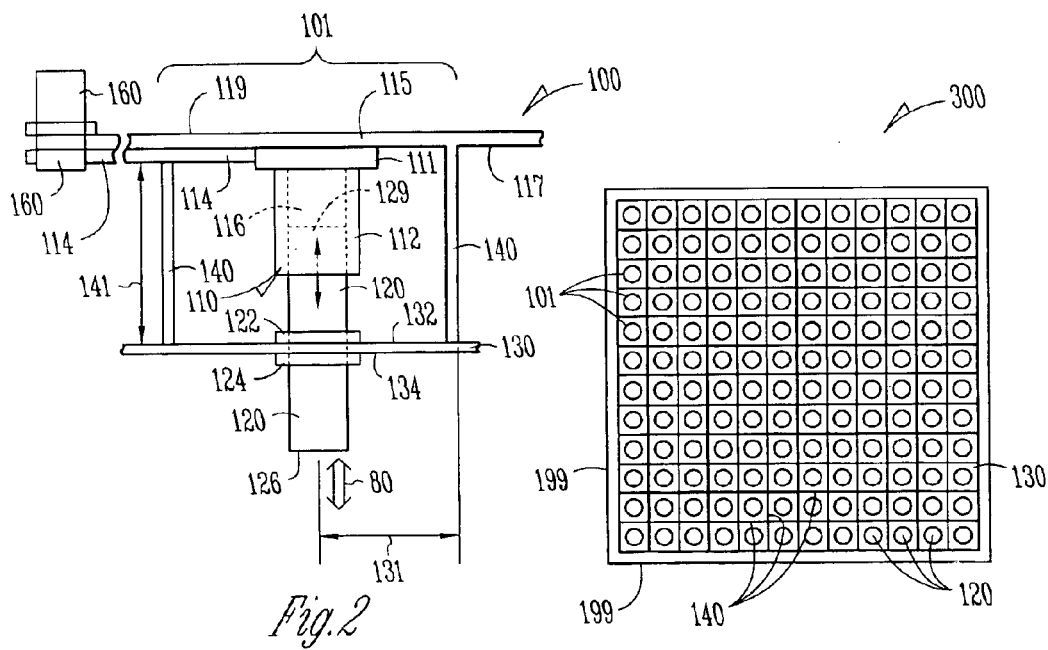
Fig. 2
Fig. 3

US 7,132,839 B2

ULTRA-SHORT LOW-FORCE VERTICAL PROBE TEST HEAD AND METHOD

FIELD OF THE INVENTION

This invention relates to the field of electronic circuit testing devices, and more specifically to a method and apparatus of an ultra-short low-force vertical probe test head.

BACKGROUND OF THE INVENTION

Bare electronic chips typically need to be tested. Frequently, the testing is done at a wafer level after the chips have been largely fabricated, but before the chips are diced apart and packaged. Such a test is often called a wafer test and sort operation, since good chips can be sorted from bad chips that fail the test, saving time and money since the bad chips are discarded (or re-worked) before the effort of packaging the chips.

Conventional test heads use buckling-beam and/or resilient-contact technologies for the contacting pins in the probe head. Long probe lead lengths are often needed to compensate for variability in probe lengths and bent probe leads, variability in the height of the balls or bumps of the circuit being tested, and to provide gentle contact force. Unfortunately, long probe leads have larger inductances and resistances which result in relatively large voltage droops across the leads, particularly for power-supply leads that draw large currents. Such voltage droops result in slower test speeds, thus requiring larger tester fleets to test a given quantity of chips per unit time. This can be a substantial capital cost to the chip manufacturer.

What is needed is a simple, inexpensive, reliable method and apparatus to test electronic chips, so that the tester is compact and places little force on each contact while reliably making contact to every signal on the chip.

BRIEF DESCRIPTION OF THE DRAWINGS

FIG. 1 is side cut-away perspective of a portion of test probe head 100.

FIG. 2 is side view of one cell 101 (having a probe pin 120) of a portion of test probe head 100.

FIG. 3 is a bottom-view schematic diagram of probe head 300.

DESCRIPTION OF PREFERRED EMBODIMENTS

Figure 4:
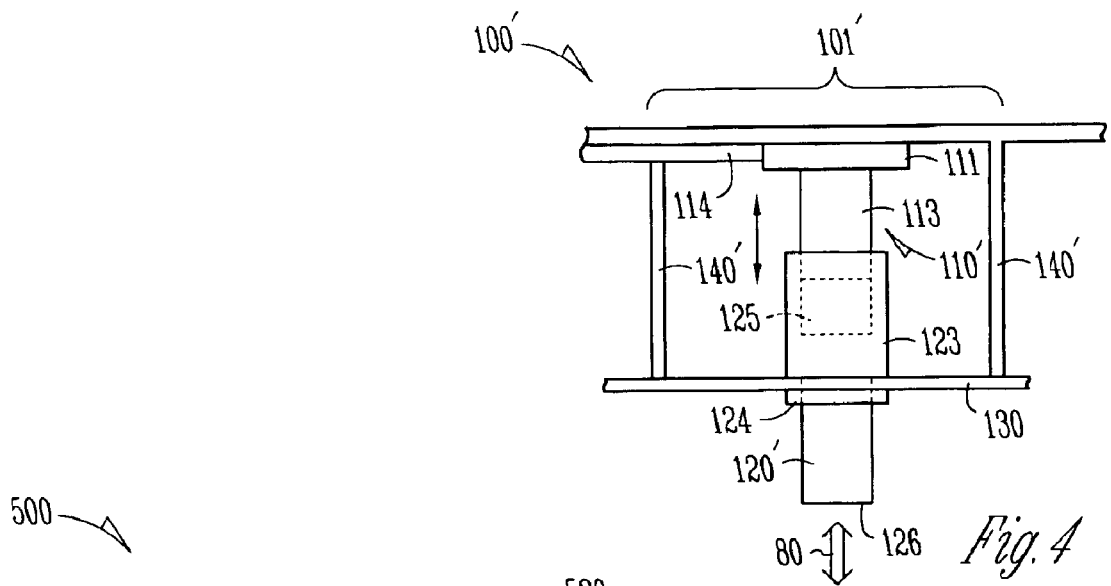
FIG. 4 is a side-view schematic diagram of an alternative cell 101' of probe head 100'.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Terminology

The terms chip, die, integrated circuit, monolithic device, semiconductor device, and microelectronic device, are used interchangeably in this description.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally copper (Cu) or an alloy of Cu and another metal such as nickel (Ni), aluminum (Al), titanium (Ti), molybdenum (Mo), or stacked layers of different metals, alloys or other combinations, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal suicides are examples of other conductors.

In this description, the term metal applies both to substantially pure single metallic elements and to alloys or combinations of two or more elements at least one of which is a metallic element.

Substrate generally refers to the physical object that is the basic workpiece that is transformed by various process operations into the desired microelectronic configuration. Substrates may include conducting material (such as copper or aluminum), insulating material (such as sapphire, ceramic, or plastic), semiconducting materials (such as silicon), non-semiconducting, or combinations of semiconducting and non-semiconducting materials. In some embodiments, substrates include layered structures, such as a sheet of material chosen for electrical and/or thermal conductivity (such as copper) covered with a layer of plastic chosen for electrical insulation, stability, and embossing characteristics.

The term vertical is defined to mean substantially perpendicular to the major surface of a substrate. Height or depth refer to a distance in a direction perpendicular to the major surface of a substrate.

FIG. 1 is side cut-away perspective of a portion of test probe head 100. Probe head 100 will be pressed against integrated circuit (IC) chip 90. On the top surface 99 of chip 90 are a plurality of signal pads, for example, solder bumps 98, which provide contact points for signal traces 97. Typically, chip 90 is one of many chips on a semiconductor wafer. One or more chips are tested at one time, and the power and signal connections to the plurality of chip signal pads 98 are made using probe pins 120. In some embodiments, larger (and/or taller) bumps 96 and larger power traces 95 are used for power connections. In some embodiments, chip 90 is one of many that are fabricated together on wafer 91 (see FIG. 6).

In some embodiments, all probe pins 120 are substantially the same, and all electrical connections 110 are substantially the same. In such embodiments, all pins 120 are sufficiently large to handle the current requirements of any signal or power connection. In other embodiments, some of the probe pins 180 are larger (e.g., in diameter) than other probe pins 120, in order to be able to handle more current and to reduce voltage droop, and these larger pins 180 are used to, for example, connect to power connections 96 (for example, having larger traces 95 to handle the extra current and reduce voltage droop). The larger probe pins 180 are the same as probe pins 120 except for the additional current-handling capability, and the discussion of pins 120 below applies to both pin 180 and pin 120 and, similarly, to any sized pin. In some embodiments, three or more different-sized pins are used. The larger probe pins 180 connect to larger electrical connections 170 that are fixed to substrate 115, and in some embodiments, include larger sleeve 172, pad 171, and trace 174. The respective rings 122 and 124 are suitably sized to fit pin 180. The substrate 115 and the various pins connected to it are sometimes called a "space transformer" because the contact pattern and spacing on the downward-pointing pins are connected (i.e., mapped or transformed) to upward-pointing pins or contacts that can have a different spacing, arrangement, and pattern.

Each probe pin 120 is attached to diaphragm 130, for example (in some embodiments), using holding ring 122 and holding ring 124 that are press-fit around pin 120 and slid into firm contact with diaphragm 130. In some such embodiments, probe pin 120 and/or rings 122 and 124 are also adhesively held to diaphragm 130. In some embodiments, one of the holding rings is replaced by a ridge (not shown, but similar to the shoulder of sleeve 123 in FIG. 4 just above diaphragm 130) formed on probe pin 120.

In other embodiments, the holding rings are replaced by a groove (not shown) in probe pin 120, wherein probe pin 120 is press-fit into the diaphragm 130 such that the diaphragm 130 fits into the groove. In yet other embodiments, probe pin 120 has no ring(s) or groove, but is only adhesively held to diaphragm 130.

Each diaphragm 130 holds its respective probe pin 120 to a default rest position when no longitudinal force (such as end force 80) is applied to the pin, wherein the top end 129 of the probe pin 120 is within sleeve 112. When force 80 (such as obtained by pressing pin 120 against contact 98) is applied to the end 126 of pin 120, the opposite end 129 slides into cavity 116 of sleeve 112, and when the force is removed, diaphragm 130 returns pin 120 to its default position. Since the diaphragm 130 surrounding each pin 120 allows its pin to slide just enough into cavity 116, probe 100 can accommodate differences in the heights of the various contacts 98 and 96.

In some embodiments, each cell 101 of probe head 100 typically has one pin 120 surrounded by one or more walls 140 that function to keep the edges of the portion of diaphragm 130 associated with that cell 101 at least at a minimum distance 141 from substrate 115 in order to keep the diaphragm portion of one cell from lifting the pins in neighboring cells.

Probe head 100 is very short (in the direction vertical in FIG. 1) and exerts low force on the contacts 98 and pins 120. The probe head 100 is moved in the vertical direction to contact IC 90.

FIG. 2 is side (partially cut away) view of a probe pin 120 of a portion (cell 101) of test probe head 100. Substrate 115 provides a space-transformer function wherein pins 120 that contact to the circuits being tested can have one pin-to-pin spacing (e.g., very close spacing for modern ICs such as processors), while the pins or contacts 160 that connect the probe head 100 to its testing system (e.g., system 610 of FIG. 6) have a different pin-to-pin spacing (e.g., much further apart). In some embodiments, the space transformer maps one pin layout on side 117 of substrate 115 to a different pin layout on side 119 (i.e., rearranging where all the connections are, and perhaps leaving the spacings the same). Trace 114 connects the electrical connection 110 on one side of substrate 115 to electrical connection 160 that faces the other side. In some embodiments, substrate 115 includes a ceramic material with multiple levels of connections, and electrical connection 110 includes a multi-layer ceramic (MLC) conductive pad 111 and conductive sleeve 112 (e.g., either or both made of metal such as copper or copper alloy). Sleeve 112 surrounds cavity 116 that is sized to snugly fit end 129 of pin 120 in order to have a good electrical connection, but also allow pin 120 to easily slide in and out. In some embodiments, pin 120 includes one or more spring fingers (not shown) that slide along and contact the inner surface of sleeve 112. In some embodiments, sleeve 112 includes one or more spring fingers (not shown) that slide along and contact the outer surface of pin 120.

In some embodiments, one or more walls 140 (e.g., arranged in a hexagonal pattern such as shown in FIG. 1, a square pattern such as shown in FIG. 3, or as a hollow cylinder or any other suitable shape to hold or press against diaphragm 130) or other shaped supports 140 (such as spaced-apart rods) are used to maintain the edge of diaphragm 130 surrounding pin 120 at distance 141 from substrate 130 when pin 120 is pushed into sleeve 112. Rings 122 (pushed against upper surface 132) and 124 (pushed against lower surface 134) hold diaphragm 130 at a fixed position on pin 120.

In some embodiments, the elastic diaphragm 130 at substantially a first radius 131 around the first pin 120 is held in a substantially fixed position relative to the substrate.

By using a supporting diaphragm 130 around each individual pin (e.g., by walls 140 or by other means), when a first pin is pushed further into its respective sleeve 112 (by displacement force 80 against end 126) than are the neighboring pins, the diaphragm 130 (as distended by the first pin) will not lift those neighboring pins off their respective contacts 98. In some embodiments, diaphragm 130 is attached to each of the walls 140 as shown in FIG. 2. In other embodiments, diaphragm 130 rests at or below each of the walls 140 as shown in FIG. 4, but is pressed against the lower edges of the walls or supports 140 when the pins 120 are pressed against contacts 98. In these embodiments, the diaphragm need only to be attached at the outer periphery 199 (as shown in FIG. 3) of the entire probe head 100, rather than being attached to the walls 140 surrounding each pin 120.

FIG. 3 is a bottom-view schematic diagram of probe head 300. Probe head 300 of FIG. 3 is the same as probe head 100 of FIG. 1, except that probe head 300 has a rectangular pattern of cells 101 such that pins 120 (each surrounded by walls 140, and held by diaphragm 130) are arranged on a Cartesian grid, whereas the pins of probe head 100 are arranged on a hexagonal grid. In other embodiments, any other suitable pattern of pins and cells are used.

FIG. 4 is a side-view schematic diagram of an alternative cell 101' of probe head 100'. Probe head 100' is conceptually the same as probe head 100 of FIG. 2, except that electrical contact 110' includes a post 113 attached and fixed to MLC pad 111, and sleeve 123 of pin 120' slides on the outside of post 113 (i.e., post 113 is in cavity 125 of pin 120'). Also, in this embodiment, diaphragm 130 is not attached to the edges of walls 140, but only rests on (or slightly below) them. The walls 140 are used to restrain diaphragm 130 from lifting the neighboring pins off their contacts when force (or displacement) 80 lifts pin 120' more than needed for neighboring pins. Some embodiments further include one or more walls 140 or posts 140' (i.e., in some embodiments, posts are used instead of or in addition to walls) located around the first pin 120 substantially perpendicular to the substrate 115 and connected to the substrate 115, and wherein the elastic diaphragm 130 presses against the one or more walls 140 or posts 141 when a force 80 is applied to an end 126 of the first pin 120'.

Figure 5:
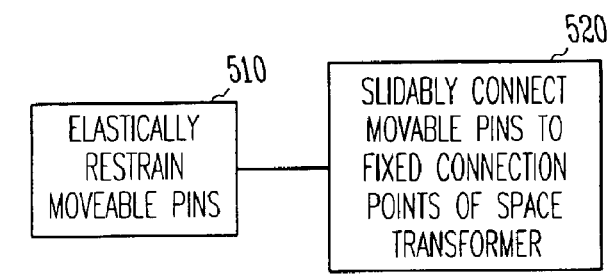
FIG. 5 is a flow chart showing fabrication method 500.

FIG. 5 is a flow chart showing fabrication method 500, used in some embodiments of the invention. At block 510, the operation of elastically restraining the moveable pins is shown (such as performed by diaphragm 130 or any other suitable structure). Block 520 shows the operation of slidably connecting the moveable pins (such as pins 120) to respective fixed connection points (such as electrical connections 110) of a space transformer (such as substrate 115).

Some embodiments of the method further include electrically connecting the first electrical contact on the first face of the substrate to a first electrical contact on the second face of the substrate, and the second electrical contact on the first face of the substrate to a second electrical contact on the second face of the substrate, wherein the first and second electrical contacts on the second face are spaced further apart than are the first and second electrical contacts on the first face.

In some embodiments of the method, the slidably connecting the first pin to the first electrical contact includes sliding a portion of the first pin within a portion of the first electrical contact.

In some embodiments of the method, the slidably connecting the first pin to the first electrical contact includes sliding a portion of the first pin around a portion of the first electrical contact. Some embodiments of the method further include configuring the first pin to handle a larger amount of electrical current than the second pin.

Some embodiments of the method further include pressing an end of the first pin against a first contact point on a first integrated circuit on a wafer, and pressing an end of the second pin against a second contact point on the first integrated circuit on the wafer. Some such embodiments further include pressing the end of the first pin against a first contact point on a second integrated circuit on a wafer, and pressing the end of the second pin against a second contact point on the second integrated circuit on the wafer.

Figure 6:
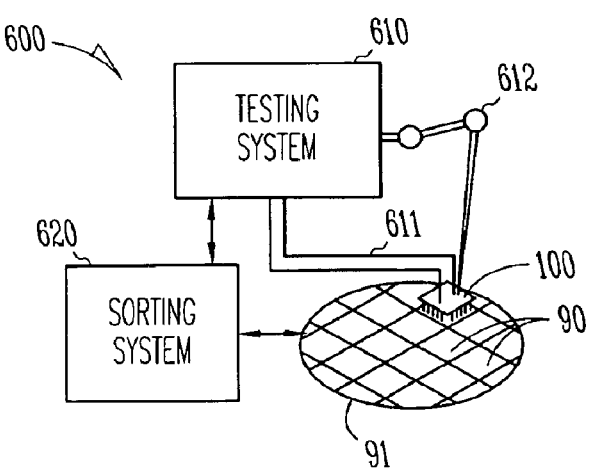
FIG. 6 is a perspective-view schematic diagram of a system 600 that uses one or more probe heads 100.

FIG. 6 is a perspective-view schematic diagram of a system 600 that uses one or more probe heads 100. Each probe head 100 is connected by cable 611 to testing system 610. In some embodiments, testing system 610 (such as a computer) operates a robotic arm 612 that moves probe head 100 into position on a successive series of chips 90 of wafer 91. Electrical stimulation signals are sent through some of the pins 120, power is supplied through pins 120 and/or 180, and electrical results signals are obtained from other pins 120, and the results compared to expected results by testing system 610 for each chip tested. In some embodiments, a sorting system 620 receives results from testing system 610, and based on those results, sorts the good chips from the faulty ones.

CONCLUSION

Some embodiments of the invention include an apparatus that includes a substrate 115, a plurality of electrical contacts including a first electrical contact 110 and a second electrical contact 170, wherein each one of the plurality of electrical contacts is fixed to a first face 117 of the substrate 115. A plurality of movable pins is also provided including a first pin 120 and a second pin 180, each one of the plurality of pins slidably connected to a corresponding one of the electrical contacts 110, 170. An elastic diaphragm 130 is connected around each one of the pins 120, 170 that holds each respective pin and that allows each pin 120, 180 to slide along its respective electrical contact 110, 170 when a force 80 is applied to an end 126 of the respective pin, and that moves each pin towards a default position when the force is removed.

In some such embodiments, the substrate 115 includes a plurality of conductive traces including a first trace 114 and a second trace 174, the first trace 114 connecting the first electrical contact 110 on the first face 117 of the substrate 115 to a first electrical contact 160 on a second face 119 of the substrate 115, the second trace 114 connecting the second electrical contact 170 on the first face 117 of the substrate 115 to a second corresponding electrical contact on the second face 119 of the substrate, wherein the first and second electrical contacts 160 on the second face 119 are spaced further apart than are the first and second electrical contacts 110, 170 on the first face 117.

In some such embodiments, the first electrical contact 110 fixed to the substrate includes a sleeve 112, and wherein an end 129 of the first pin 120 fits inside the sleeve 112 of the corresponding electrical contact 110.

Some embodiments further include one or more walls 140 surrounding the first pin 120 that connect between the substrate 115 and the elastic diaphragm 130 connected around the first pin 120.

Some embodiments include a system 600 that includes a probe head 100 that includes the above described features, the system 600 further comprising one or more information-processing systems 610 and/or 620 that collect testing results from a plurality of integrated circuits that are contacted using the probe head, and based on the testing results, that are sorted.

Some embodiments further include one or more walls 140' (see FIG. 4) located around the first pin 120 substantially perpendicular to the substrate 115 and connected to the substrate 115, and wherein the elastic diaphragm 130 presses against the one or more walls when a force 80 is applied to an end 126 of the first pin 120'.

Some embodiments further include one or more spacers 140 arranged around each one of the plurality of pins, each spacer 140 connecting to the substrate 115 and to the elastic diaphragm 130.

In some embodiments, the elastic diaphragm 130 at substantially a first radius 131 around the first pin 120 is held in a substantially fixed position relative to the substrate.

Some embodiments further include a first ring 122 that fits around the first pin 120 and contacts a first face 132 of the elastic diaphragm 130, and a second ring 124 that fits around the first pin 120 and contacts an opposite second face 134 of the elastic diaphragm 130, the first ring 122 and the second ring 124 holding the first pin 120 to the elastic diaphragm 130. In some embodiments, when a force 80 is applied to the end 126 of the pin 120, the diaphragm 130 provides a small resisting force, but allows the end 129 of the pin 120 to slide within sleeve 112.

In some embodiments, each one of the electrical contacts 110' fixed to the substrate 115 includes a post 113, and wherein an end 123 (e.g., in some embodiments, a sleeve, while in other embodiments, a plurality of fingers) of each moveable pin 120' fits around the post 113 of the corresponding electrical contact 110'.

In some embodiments, the second pin 180 is larger than the first pin 120, in order to handle a larger amount of electrical current.

Some embodiments of another aspect of the invention include a method for connecting a plurality of pins to a substrate. This method includes providing a substrate having a first electrical contact fixed to a first face of the substrate and a second electrical contact fixed to the first face of the substrate, slidably connecting a first pin to the first electrical contact, slidably connecting a second pin to the second electrical contact, elastically restraining the first pin to return to a default position when an applied force is removed from the first pin, and elastically restraining the second pin to return to a default position when an applied force is removed from the second pin.

Some embodiments of the method further include electrically connecting the first electrical contact on the first face of the substrate to a first electrical contact on the second face of the substrate, and the second electrical contact on the first face of the substrate to a second electrical contact on the second face of the substrate, wherein the first and second electrical contacts on the second face are spaced further apart than are the first and second electrical contacts on the first face.

In some embodiments of the method, the slidably connecting the first pin to the first electrical contact includes sliding a portion of the first pin within a portion of the first electrical contact.

In some embodiments of the method, the slidably connecting the first pin to the first electrical contact includes sliding a portion of the first pin around a portion of the first electrical contact.

Some embodiments of the method further include configuring the first pin to handle a larger amount of electrical current than the second pin and to reduce voltage droop.

Some embodiments of the method further include pressing an end of the first pin against a first contact point on a first integrated circuit on a wafer, and pressing an end of the second pin against a second contact point on the first integrated circuit on the wafer. Some such embodiments further include pressing the end of the first pin against a first contact point on a second integrated circuit on a wafer, and pressing the end of the second pin against a second contact point on the second integrated circuit on the wafer.

Some embodiments of another aspect of the invention include an apparatus that has a space-transformer substrate, and slidable vertical-probe connection means as described herein for connecting a plurality of electrical signals on the substrate to a corresponding plurality of electrical contacts on an electrical part.

In some embodiments, the slidable vertical-probe connection means includes a diaphragm means for applying a longitudinal force to each of a plurality of movable electrical connector means of the slidable vertical-probe connection means.

In some embodiments, the slidable vertical-probe connection means includes a sleeve-and-pin means for maintaining electrical contact to each of a plurality of movable electrical connector means of the slidable vertical-probe connection means.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An apparatus comprising:

a substrate;

a plurality of electrical contacts including a first electrical contact and a second electrical contact, wherein each one of the plurality of electrical contacts is fixed to a first face of the substrate;

a plurality of movable pins including a first pin and a second pin, each one of the plurality of pins slidably connected to a corresponding one of the electrical contacts; and a plurality of elastic diaphragms, each connected around each one of the pins, wherein each of the plurality of elastic diaphragms holds each respective pin and allows each pin to slide along its respective electrical contact when a force is applied to an end of the respective pin, and moves each pin towards a default position when the force is removed.

2. The apparatus of claim 1, wherein the substrate includes a plurality of conductive traces including a first trace and a second trace, the first trace connecting the first electrical contact on the first face of the substrate to a first electrical contact on a second face of the substrate, the second trace connecting the second electrical contact on the first face of the substrate to a second electrical contact on the second face of the substrate, wherein the first and second electrical contacts on the second face are spaced further apart than are the first and second electrical contacts on the first face.

3. The apparatus of claim 1, wherein the first electrical contact fixed to the substrate includes a sleeve, and wherein an end of the first pin fits inside the sleeve of the corresponding electrical contact.

4. A system that includes a probe head comprising the apparatus of claim 1, the system further comprising one or more information-processing systems that collect testing results from a plurality of integrated circuits that are contacted using the probe head, and based on the testing results, sorted.

5. The apparatus of claim 1, further comprising one or more walls located around the first pin substantially perpendicular to the substrate and connected to the substrate, and wherein a first elastic diaphragm connected around the first pin presses against the one or more walls when a force is applied to an end of the first pin.

6. The apparatus of claim 1, further comprising one or more spacers arranged around each one of the plurality of pins, each spacer connecting to the substrate and to one of the plurality of elastic diaphragms.

7. The apparatus of claim 1, wherein a first elastic diaphragm at substantially a first radius around the first pin is held in a substantially fixed position relative to the substrate.

8. The apparatus of claim 1, further comprising a first ring that fits around the first pin and contacts a first face of a first elastic diaphragm, and a second ring that fits around the first pin and contacts an opposite second face of the first elastic diaphragm, the first and second rings holding the first pin to the first elastic diaphragm.

9. The apparatus of claim 1, wherein each one of the electrical contacts fixed to the substrate includes a post, and wherein an end of each moveable pin fits around the post of the corresponding electrical contact.

10. The apparatus of claim 1, wherein the first pin is larger than the second pin in order to handle a larger amount of electrical current.

11. An apparatus comprising:

a substrate;

a plurality of electrical contacts including a first electrical contact and a second electrical contact, wherein each one of the plurality of electrical contacts is fixed to a first face of the substrate and includes a post;

a plurality of movable pins including a larger first pin and a smaller second pin, each one of the plurality of pins slidably connected to a corresponding one of the electrical contacts, wherein an end of each moveable pin fits around the post of the corresponding electrical contact;

a plurality of elastic diaphragms, each connected around each one of the pins, wherein each of the plurality of elastic diaphragms holds each respective pin and allows each pin to slide along its respective electrical contact when a force is applied to an end of the respective pin, and moves each pin towards a default position when the force is removed;

one or more walls located around the first pin substantially perpendicular to the substrate and connected to the substrate, wherein a first elastic diaphragm connected around the first pin presses against the one or more walls when a force is applied to an end of the first pin; and a first ring that fits around the first pin and contacts a first face of the first elastic diaphragm, and a second ring that fits around the first pin and contacts an opposite second face of the first elastic diaphragm, the first and second rings holding the first pin to the first elastic diaphragm.

12. The apparatus of claim 11, further comprising one or more spacers arranged around each one of the plurality of pins, each spacer connecting to the substrate and to one of the plurality of elastic diaphragms.

13. The apparatus of claim 11, wherein the first elastic diaphragm at substantially a first radius around the first pin is held in a substantially fixed position relative to the substrate.

14. A method for connecting a plurality of pins to a substrate, the method comprising:

providing a substrate having a first electrical contact fixed to a first face of the substrate and a second electrical contact fixed to the first face of the substrate;

slidably connecting a first pin to the first electrical contact;

slidably connecting a second pin to the second electrical contact, wherein the first pin is configured to handle a larger amount of electrical current than the second pin;

elastically restraining the first pin to return to a default position when an applied force is removed from the first pin; and elastically restraining the second pin to return to a default position when an applied force is removed from the second pin.

15. The method of claim 14 wherein the slidably connecting the first pin to the first electrical contact includes sliding a portion of the first pin within a portion of the first electrical contact.

16. The method of claim 14, wherein the slidably connecting the first pin to the first electrical contact includes sliding a portion of the first pin around a portion of the first electrical contact.

* * * * *